United States Patent
Wang

(10) Patent No.: US 10,115,458 B2
(45) Date of Patent: Oct. 30, 2018

(54) PERFORM READ OR WRITE ON A NON-VOLATILE MEMORY HAVING A PENDING READ OR WRITE BASED ON TEMPERATURE THEREOF

(71) Applicant: Toshiba Memory Corporation, Tokyo (JP)

(72) Inventor: Ge Wang, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/446,982

(22) Filed: Mar. 1, 2017

(65) Prior Publication Data
US 2017/0285944 A1   Oct. 5, 2017

Related U.S. Application Data

(60) Provisional application No. 62/315,072, filed on Mar. 30, 2016.

(51) Int. Cl.
| G11C 11/56 | (2006.01) |
| G06F 3/06 | (2006.01) |
| G11C 7/04 | (2006.01) |

(52) U.S. Cl.
CPC .......... G11C 11/5642 (2013.01); G06F 3/061 (2013.01); G06F 3/0619 (2013.01); G06F 3/0655 (2013.01); G06F 3/0688 (2013.01); G11C 7/04 (2013.01)

(58) Field of Classification Search
CPC ...... G06F 3/061; G06F 3/0655; G06F 3/0688; G11C 7/04
See application file for complete search history.

(56) References Cited

U.S. PATENT DOCUMENTS

| 2012/0224425 A1* | 9/2012 | Fai | G11C 11/5642 365/185.09 |
| 2013/0166885 A1 | 6/2013 | Ramani et al. | |
| 2016/0117216 A1* | 4/2016 | Muchherla | G06F 11/08 714/6.11 |
| 2016/0162219 A1* | 6/2016 | Erez | G06F 3/0653 711/103 |
| 2017/0200492 A1* | 7/2017 | Yang | G11C 11/5642 |
| 2017/0255403 A1* | 9/2017 | Sharon | G06F 3/0619 |

FOREIGN PATENT DOCUMENTS

| JP | 3870189 | 1/2007 |
| JP | 2012-168665 | 9/2012 |
| JP | 2014-174849 | 9/2014 |

* cited by examiner

*Primary Examiner* — Ajay Ojha
(74) *Attorney, Agent, or Firm* — Patterson & Sheridan, LLP

(57) ABSTRACT

A memory system includes a plurality of non-volatile memories, one or more temperature sensors each of which is disposed in or adjacent to one of the non-volatile memories, and a controller. The controller is configured to maintain a temperature increase amount and a reference temperature for each of the non-volatile memories, and select one of the non-volatile memories having a pending command as a next memory to be accessed based on a current temperature, the temperature increase amount, and the reference temperature of the selected non-volatile memory, and access the selected non-volatile memory to perform the pending command.

17 Claims, 13 Drawing Sheets

FIG. 3

| LBA | PBA | | DATA PRESENCE/ABSENCE |
|---|---|---|---|
| | BLOCK ID | PAGE ID | |
| | | | |
| | | | |
| | | | |
| ⋮ | ⋮ | ⋮ | ⋮ |

FIG. 4

| LOGICAL BLOCK ID | USED/UNUSED | VALID DATA RATE | ERROR PRESENCE/ABSENCE |
|---|---|---|---|
| | | | |
| | | | |
| | | | |
| | | | |

| ID | MEASURED TEMPERATURE |
|---|---|
| ID-1 | T-1 |
| ID-2 | T-2 |
| ⋮ | ⋮ |

~1440(CH-n)

PERFORM READ OR WRITE ON A NON-VOLATILE MEMORY HAVING A PENDING READ OR WRITE BASED ON TEMPERATURE THEREOF

CROSS-REFERENCE TO RELATED APPLICATIONS

This application is based upon and claims the benefit of priority from U.S. Provisional Patent Application No. 62/315,072, filed on Mar. 30, 2016, the entire contents of which are incorporated herein by reference.

FIELD

Embodiments described herein relate generally relate to a memory system and an operation method of the memory system.

BACKGROUND

In general, non-volatile semiconductor memories of a memory system generate heat during their operations.

BRIEF DESCRIPTION OF THE DRAWINGS

FIG. 3 illustrates a structure of an address conversion table used in the memory system according to the embodiment.

FIG. 4 illustrates a structure of a block management table used in the memory system according to the embodiment.

FIG. 5 illustrates a structure of a NAND temperature table used in the memory system according to the embodiment.

DETAILED DESCRIPTION

A memory system according to an embodiment includes a plurality of non-volatile memories, one or more temperature sensors each of which is disposed in or adjacent to one of the non-volatile memories, and a controller. The controller is configured to maintain a temperature increase amount and a reference temperature for each of the non-volatile memories, select one of the non-volatile memories having a pending command as a next memory to be accessed based on a current temperature, the temperature increase amount, and the reference temperature of the selected non-volatile memory, and access the selected non-volatile memory to perform the pending command.

Hereinafter, a memory system according to an embodiment and a method of controlling the memory system will be described with reference to the drawings.

Figure 1:
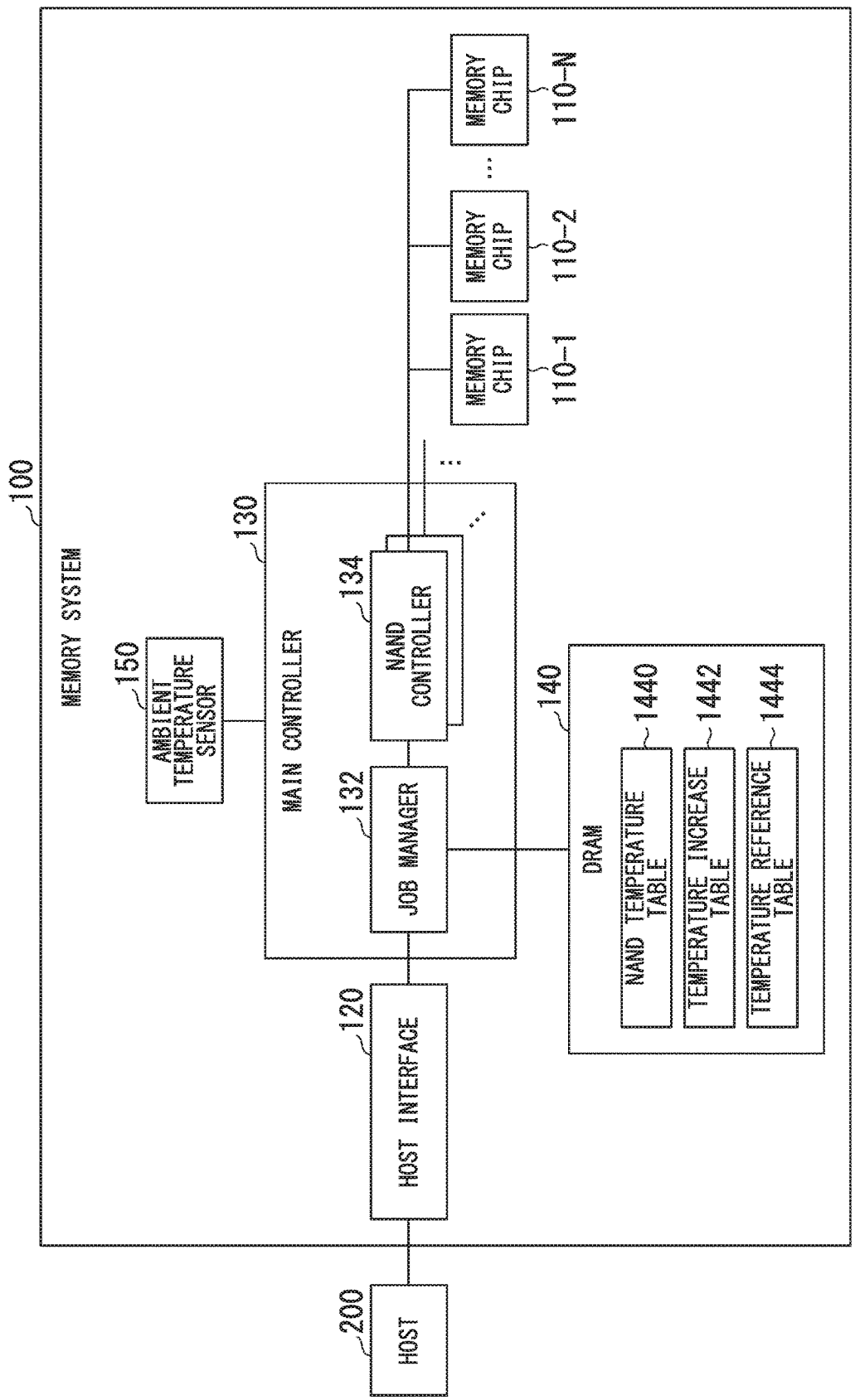
FIG. 1 is a block diagram of a memory system according to an embodiment.

FIG. 1 is a block diagram of a memory system 100 according to an embodiment. The memory system 100 performs transmission and reception of a request and data to and from the host device 200. The memory system 100 functions as an external storage device of the host device 200.

The host device 200 may be, for example, an information processing device such as a personal computer, a server device, a portable phone, and an imaging device, may be a portable terminal such as a tablet computer or a smartphone, may be a game machine, or may be an in-vehicle terminal such as a car navigation system. The host device 200 transmits a read request to the memory system 100 to read data from the memory system 100. Then, the host device 200 receives the data transmitted from the memory system 100. Also, the host device 200 transmits a write request and data to the memory system 100 to write the data in the memory system 100. Also, the host device 200 transmits an erase request to the memory system 100 to erase data from the memory system 100.

The memory system 100 is, for example, a solid state drive (SSD), but is not limited thereto. The memory system 100 may include a plurality of NAND memories 110-1, 110-2, ..., 110-N (N is any natural number), a host interface 120, a main controller 130, a dynamic random access memory (DRAM) 140, and an ambient temperature sensor 150, but not limited thereto. In the following description, each of the NAND memories is referred to as a "NAND memory 110" when not distinguished from the other NAND memories.

Figure 2:
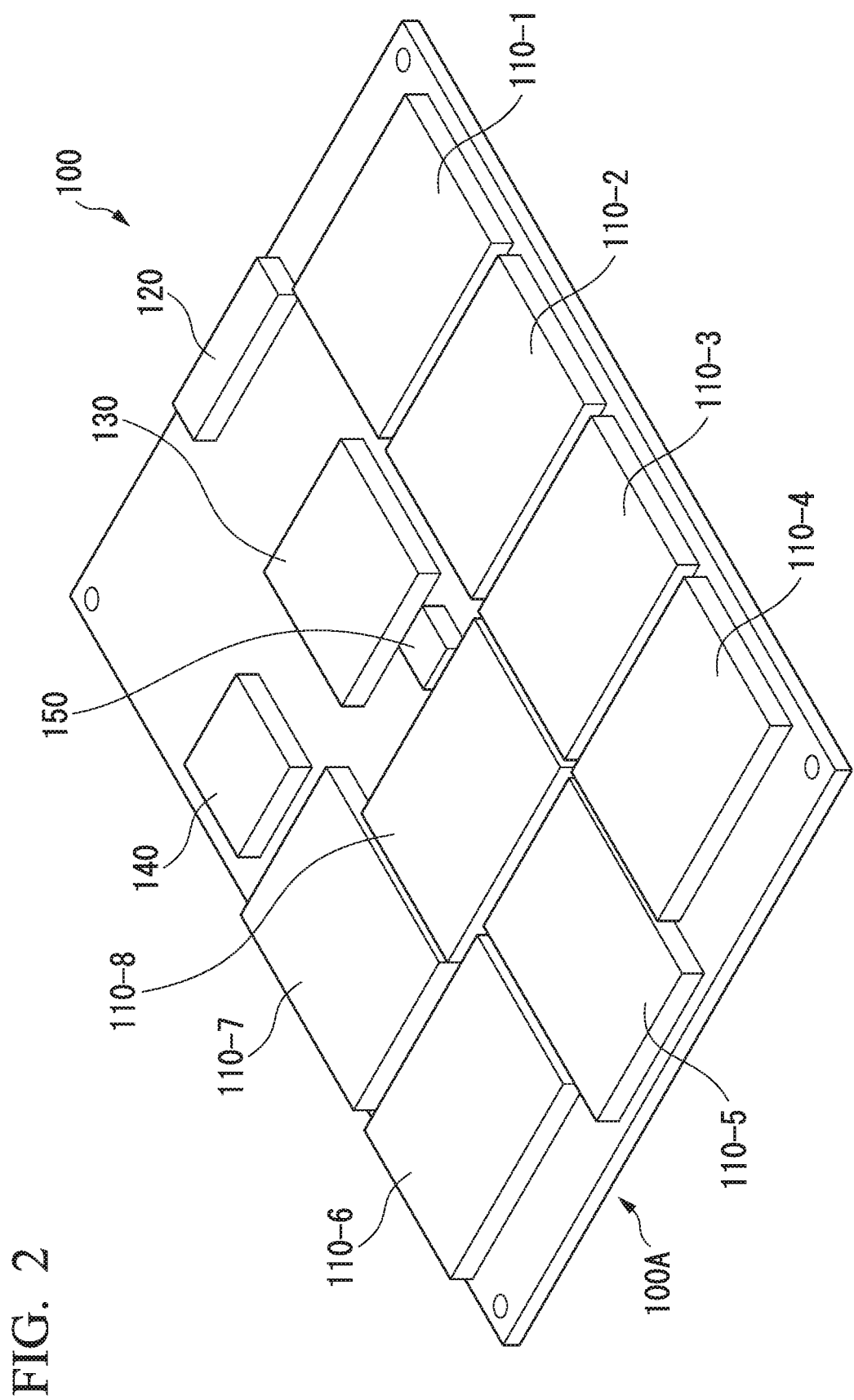
FIG. 2 is a perspective view of the memory system according to the embodiment.

FIG. 2 is a perspective view of the memory system 100 according to the present embodiment. The memory system 100 includes a board 100A. On the board 100A, the NAND memories 110-1, 110-2, 110-3, 110-4, 110-5, 110-6, 110-7, and 110-8, the host interface 120, the main controller 130, the DRAM 140, and the ambient temperature sensor 150 are mounded. Also, an arrangement of the NAND memories 110-1, 110-2, 110-3, 110-4, 110-5, 110-6, 110-7, and 110-8, the host interface 120, the main controller 130, the DRAM 140, and the ambient temperature sensor 150 illustrated in FIG. 2 is an example, and the arrangement is not limited thereto.

Each of the NAND memories 110 is a memory chip in which a NAND memory cell array is sealed. The NAND memory 110 is arranged to have a side surface facing another NAND memory 110, the main controller 130, the DRAM 140, or the ambient temperature sensor 150 via a gap having any length. The ambient temperature sensor 150 is arranged at a position surrounded by the main controller 130, the NAND memories 110-1 to 110-8, and the DRAM 140. The ambient temperature sensor 150 measures an ambient temperature within a housing (not illustrated) in which the NAND memory 110 is stored. The ambient temperature sensor 150 corresponds to a second temperature sensor.

The NAND memory 110 is an example of a non-volatile memory. The NAND memory 110 includes a memory cell array including a plurality of memory cells. The memory cell array includes a plurality of physical blocks each of which includes a plurality of memory cells. The physical block includes a plurality of physical pages. Each physical block includes, for example, 16 physical pages. Writing of data in and reading of data from the NAND memory 110 are performed in units of one physical page by the main controller 130. Data in the NAND memory 110 are erased by the main controller 130 in units of one physical block.

The host interface 120 communicates with the host device 200 according to a predetermined interface standard. The interface standard is, for example, serial advanced technology attachment (SATA), serial attached small computer system interface (SCSI) (SAS), peripheral components interconnect express (PCIe), or the like. The host interface 120 receives a write request, a read request, or an erase request transmitted by the host device 200. The host interface 120 transmits a received request (command) to the main controller 130. Also, the host interface 120 transmits data received from the DRAM 140 as a response to the read request to the host device 200.

The main controller 130 may include a job manager 132 and a plurality of NAND controllers 134, but not limited thereto. The job manager 132 and the NAND controller 134 are implemented by a processor such as a central processing unit (CPU) executing a program stored in a program memory. One or both of the job manager 132 and the NAND controller 134 may be implemented by hardware such as large scale integration (LSI), an application specific integrated circuit (ASIC), or a field-programmable gate array (FPGA) or implemented by a combination of hardware and a program. The job manager 132 and the NAND controller 134 may be an integrated information processing device or separate information processing devices.

The job manager 132 manages jobs to be executed by the NAND controller 134. The job manager 132 generates a job of executing an operation corresponding to a request. The job of executing the operation corresponding to the request includes a process of reading data in response to the read request, a process of writing data in response to the write request, and a process of erasing data in response to an erase request.

Also, the job manager 132 generates a job of managing physical blocks of the NAND memory 110. The job of managing the physical blocks includes a process of preparing a free block, refresh, garbage collection, wear leveling, and throttling, but not limited thereto. The process of preparing a free block may include the refresh, the garbage collection, and the wear leveling, a read process of reading data from the NAND memory 110, a write process of writing data to the NAND memory 110, and an erase process of erasing data from the NAND memory 110, but the present invention is not limited thereto.

Further, when a job is executed, the job manager 132 manages a temperature of the NAND memory 110.

Each NAND controller 134 corresponds to one channel. The channel is a unit of access to the NAND memories 110 by the NAND controller 134. If there are M NAND controllers 134, M channels are provided, wherein M is a natural number. A plurality of NAND memories 110 is connected to each NAND controller 134. A job is allocated to one of the NAND controllers 134 by the job manager 132. The NAND controller 134 executes a process corresponding to the allocated job. The process corresponding to the job is a process of transmitting a read request (command), a write request (command), or an erase request (command) to the NAND memory 110 and a process of receiving data requested by the read request (command).

The DRAM 140 is implemented by a semiconductor memory capable of being randomly accessed at a higher speed than the NAND memory 110. The DRAM 140 may be a synchronous dynamic radon access memory (SDRAM) or a static random access memory (SRAM).

The DRAM 140 may include a data buffer, and the data buffer may include a write buffer and a read buffer (not illustrated). When the memory system 100 is activated (i.e., operates), an address conversion table and a block management table are loaded to the DRAM 140. The address conversion table and the block management table are information necessary to determine a NAND memory 110 with respect to which a read, written, or erased operation is carried out.

FIG. 3 illustrates a structure of an address conversion table according to the present embodiment. The address conversion table is table data indicating a relationship between a logical address and a physical address. The logical address is information which specifies a logical block and a logical page to which data are written. The physical address indicates a physical storage position of the NAND memory 110. In the address conversion table, for example, a logical block address (LBA), a storage position (a physical block address (PBA) or a physical address) on the NAND memory 110, and a data presence/absence flag indicating whether data are stored in the physical block are associated with each other in each entry. The PBA may be represented by a block ID and a page ID, but is not limited thereto.

The address conversion table is referred to when a write, read, or erase operation is carried out. The address conversion table is updated when data are written or erased or a logical block is remapped.

FIG. 4 illustrates a structure of the block management table according to the present embodiment. Use/non-use information, a valid data ratio, and error presence/absence are associated with each logical block ID. The logical block ID is logical block identification information.

The use/non-use information is information indicating whether a physical block corresponding to a logical block is an active block or a free block. The free block is a block in which no valid data are stored. After data stored in the free block are erased, new data can be written. The valid data are data associated with a logical address. The valid data ratio is a ratio of the number of pages in which valid data are stored with respect to a number of physical pages included in each physical block. The error presence/absence indicates whether or not an error has been detected when a read or write operation is carried out with respect to a physical block corresponding to the logical block.

Further, while the memory system 100 is activated, the NAND temperature table 1440, the temperature increase table 1442, and the reference temperature table 1444 are maintained in the DRAM 140. The NAND temperature table 1440, the temperature increase table 1442, and the reference temperature table 1444 are information necessary to manage the temperature of the NAND memory 110. While the memory system 100 is activated, the NAND temperature table 1440 is generated by the main controller 130 and maintained in the DRAM 140. The reference temperature table 1442 and the reference temperature table 1444 are stored in the NAND memory 110. While the memory system 100 is activated, the reference temperature table 1442 and the reference temperature table 1444 are read from the NAND memory 110 and loaded to the DRAM 140.

FIG. 5 illustrates a structure of the NAND temperature table 1440 according to the present embodiment. The NAND temperature table 1440 includes an identifier (ID) and a measured temperature. The ID is an example of information for specifying the NAND memory 110. If the NAND memory 110 is a memory chip, the ID specifies the memory chip. The measured temperature is information indicating a measured value of a temperature of the NAND memory 110. That is, the NAND temperature table 1440 indicates a relationship between an identifier of the NAND memory 110 and the measured temperature of the NAND memory 110.

Figure 6:
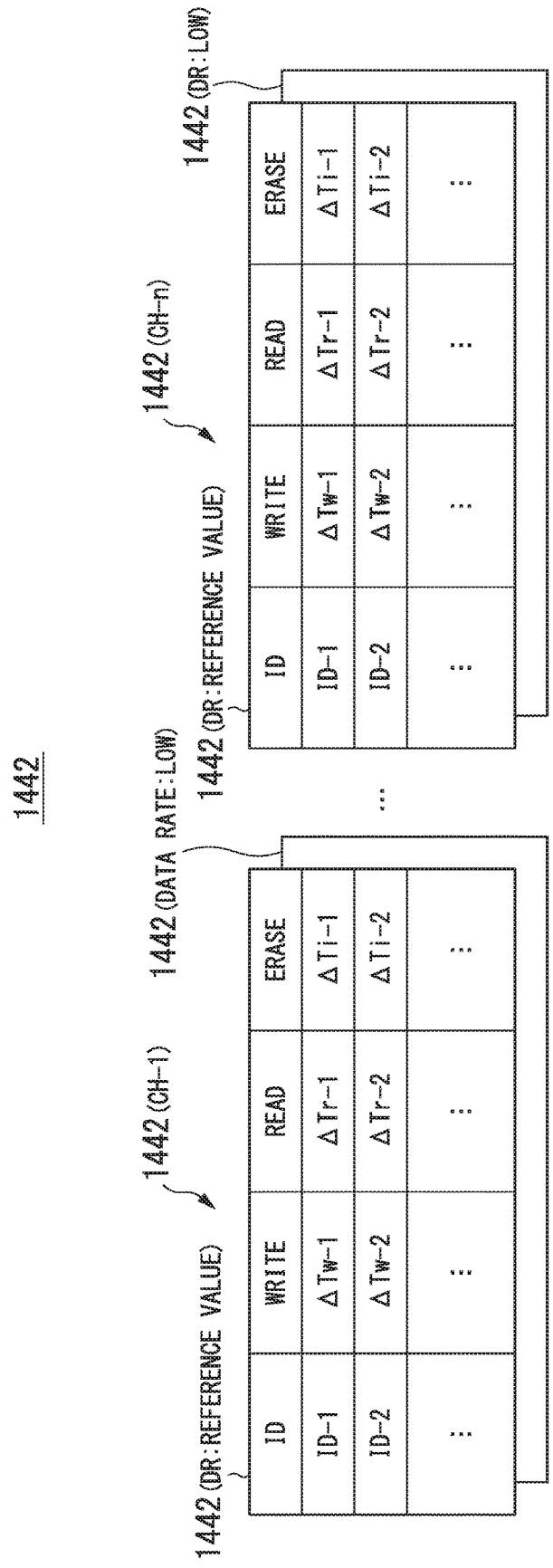
FIG. 6 illustrates a structure of a temperature increase table used in the memory system according to the embodiment.

FIG. 6 illustrates a structure of the temperature increase table 1442 according to the present embodiment. The temperature increase table 1442 includes an ID, a temperature increase ΔTw of the NAND memory 110 when a write operation has been carried out, a temperature increase ΔTr of the NAND memory 110 when a read operation has been carried out, and a temperature increase ΔTi of the NAND memory 110 when an erase operation has been executed. The temperature increase table 1442 is set for every channel and for every data transfer rate (DR). The data transfer rate is an example of a processing rate of a signal in the NAND controller 134. The temperature increase is set based on a heat generation amount of the NAND memory 110 when the NAND memory 110 has executed an operation corresponding to a request.

Figure 7:
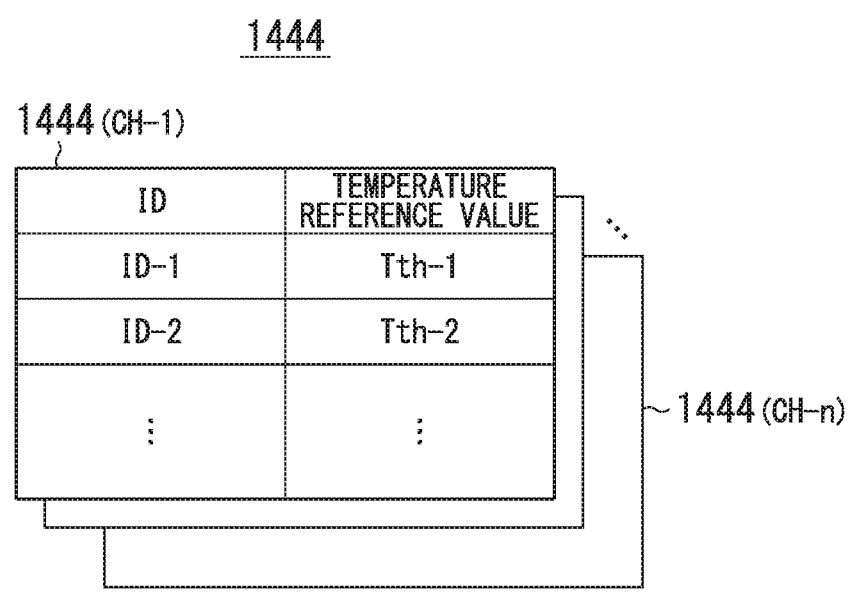
FIG. 7 illustrates a structure of a reference temperature table used in the memory system according to the embodiment.

FIG. 7 illustrates a structure of the reference temperature table 1444 according to the present embodiment. The reference temperature table 1444 includes an ID and a temperature reference value. The temperature reference value is a value used as a reference below which the NAND controller 134 accesses the NAND memory 110. The temperature reference value is set to a temperature lower than an upper limit value of the NAND memory 110. For example, the temperature reference value corresponding to a NAND memory 110 surrounded by the other NAND memories 110 is set to be lower than those of the other NAND memories 110. This is because the temperature of the NAND memory 110 surrounded by the other NAND memories 110 is less likely to become lower than that of the other NAND memories 110.

Figure 8:
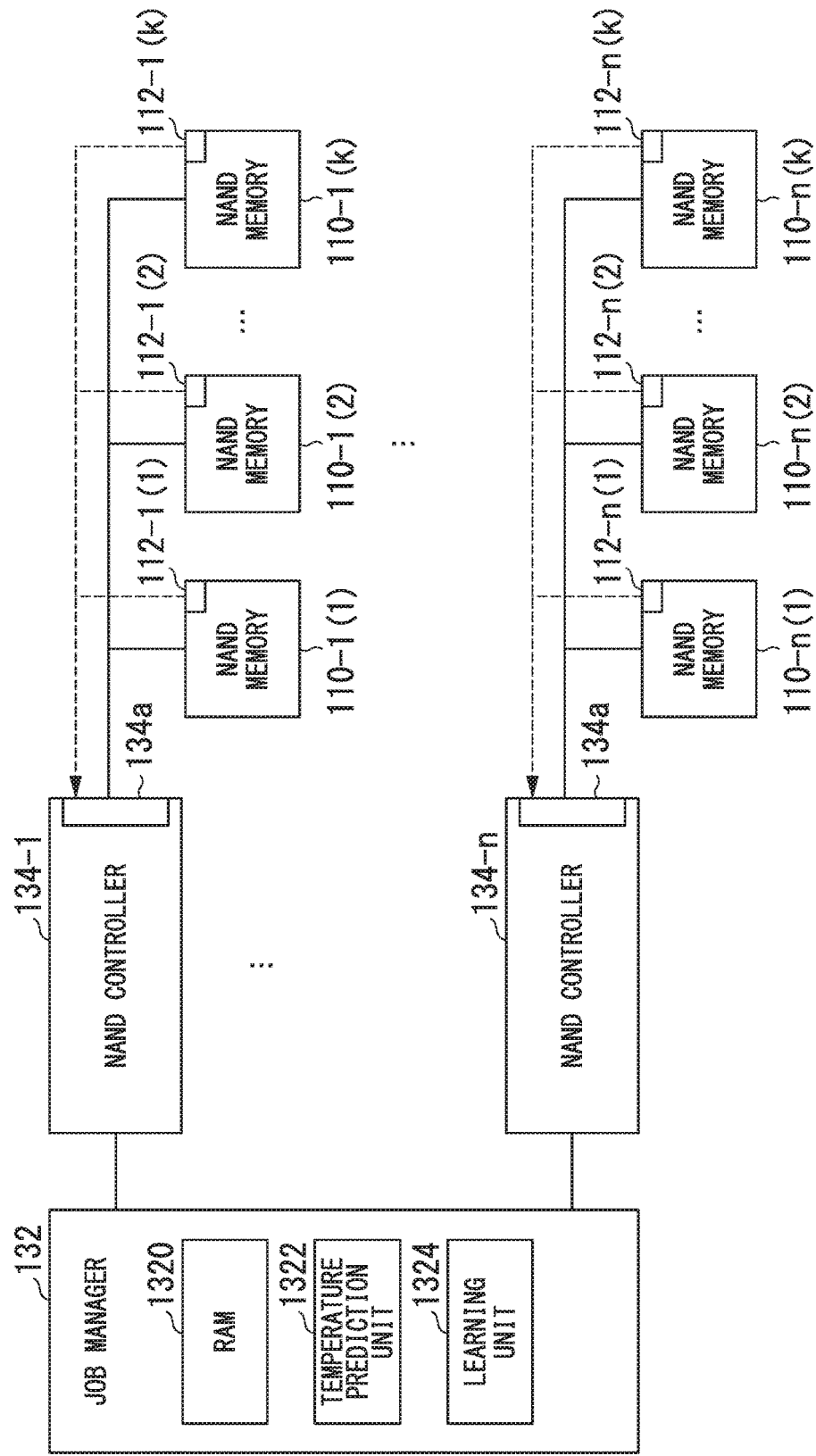
FIG. 8 is a block diagram of a job manager and a NAND controller in the memory system according to the embodiment.

Hereinafter, FIG. 8 is a block diagram of the job manager 132 and the NAND controller 134 according to the present embodiment.

A chip temperature sensor 112 is included in each of the NAND memories 110. Each of the chip temperature sensors 112 measures temperature of the corresponding NAND memory 110. The chip temperature sensor 112 may measure temperature within the NAND memory 110, but not limited thereto. The chip temperature sensor 112 may measure a surface temperature of the NAND memory 110. The chip temperature sensor 112 outputs a signal indicating the temperature of the NAND memory 110 to the NAND controller 134. A dotted arrow of FIG. 8 indicates that a signal indicating the temperature of the NAND memory 110 measured by the chip temperature sensor 112 is transmitted to the NAND controller 134.

The job manager 132 may include a RAM 1320, a temperature prediction unit 1322, and a learning unit 1324, but not limited thereto. The RAM 1320 is an example of a volatile memory. A job is written in the RAM 1320. The job includes a write request (command), a read request (command), or an erase request (command), a physical address of the NAND memory 110 for executing the request (command), etc.

The temperature prediction unit 1322 predicts a temperature of a NAND memory 110 when an operation corresponding to the job is executed by the NAND memory 110. The learning unit 1324 updates the temperature increase table 1442 and the reference temperature table 1444 based on a result of the operation corresponding to the job executed by the NAND memory 110.

The NAND controller 134 includes a NAND interface 134a. A plurality of NAND memories 110(1) to 110-1(k) belonging to the same channel are connected to the NAND interface 134a. k is a natural number. A data transfer rate is preset in the NAND interface 134a. The data transfer rate is a processing rate at which a signal is transmitted or received. The data transfer rate is set by writing a value in a register of the main controller 130. According to the value written in the register, the NAND controller 134 sets the data transfer rate. The NAND controller 134 changes the data transfer rate according to control of the NAND controller 134. Also, the data transfer rate may be referred to as an operation frequency of the NAND interface 134a.

The NAND interface 134a outputs the command corresponding to the job to the NAND memory 110. The NAND memory 110 inputs the command and operates according to the command. The NAND memory 110 outputs a response corresponding to the command to the NAND interface 134a. The response corresponding to the command includes data read in response to the read command, but not limited thereto. The NAND interface 134a inputs a response corresponding to the request and transfers the input response to the NAND controller 134.

Further, signals transmitted by the chip temperature sensors 112(1) to 112-1(k) disposed in the NAND memories 110(1) to 110-1(k) are supplied to the NAND interface 134a. The NAND controller 134 supplies temperature information of the NAND memory 110 to the job manager 132 based on the signal received by the NAND interface 134a.

Also, each NAND memory 110 may include one chip temperature sensor 112, but not limited thereto. One chip temperature sensor 112 may be provided for a plurality of NAND memories 110. Also, the memory system 100 may include a plurality of chip temperature sensors 112, but not limited thereto. In this case, the chip temperature sensor 112 measures a temperature at a position between the NAND memories 110. The job manager 132 estimates the temperature of the NAND memory 110 based on the position of the chip temperature sensor 112 and the temperature of the NAND memory 110. The job manager 132 may pre-store a relationship between the position of the chip temperature sensor 112 and the temperature of the NAND memory 110 and acquire the temperature of the NAND memory 110 corresponding to the temperature of the chip temperature sensor 112.

In the memory system 100 according to the present embodiment, one of the NAND memories 110 is determined as a transmission destination of a command corresponding to a request received from the host device 200 based on a temperature measure by the chip temperature sensor 112, a temperature increase, and a temperature reference value, and the command is transmitted to the determined NAND memory 110. This procedure will be described below in detail.

Figure 9A:
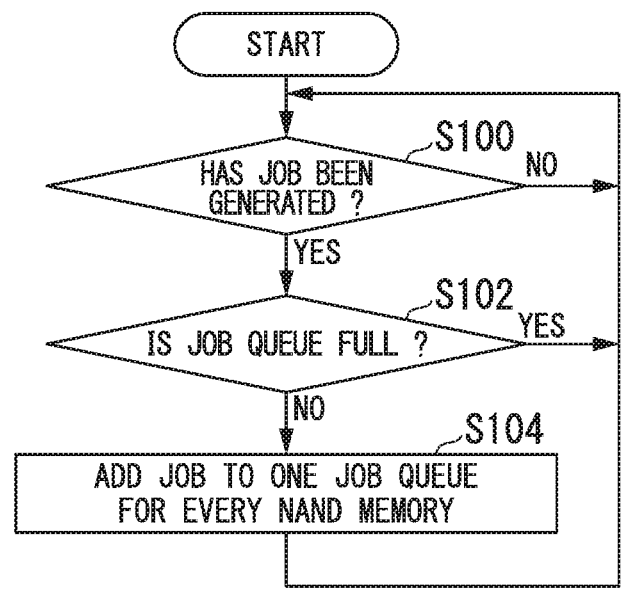
FIG. 9A is a flowchart of a process of adding a job, carried out in the memory system according to the embodiment.

FIG. 9A is a flowchart illustrating a process of adding a job in the memory system 100 according to the present embodiment. The memory system 100 determines whether or not a job to be executed by the NAND controller 134 has been generated (S100). If a job to be executed by the NAND controller 134 has been generated, the job manager 132 determines whether a job queue to which the generated job is added is in a full state (S102). The full state is a state in which the number of jobs queued in the job queue is equal to an upper limit number. When the job queue is not in the full state, the job manager 132 adds the generated job to one of a plurality of job queues stored in the RAM 1320 (S104). Here, the job manager 132 adds the job to a job queue corresponding to the NAND memory 110 determined as the transmission destination of the command corresponding to the job. The process returns to S100 if the job queue is in the full state.

Figure 9B:
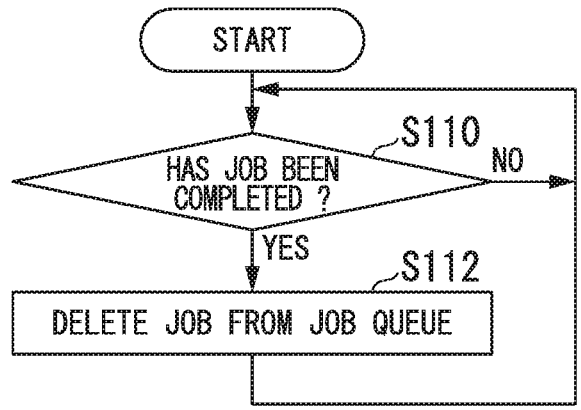
FIG. 9B is a flowchart illustrating a process of erasing a job, carried out in the memory system according to the embodiment.

FIG. 9B is a flowchart illustrating a process of erasing a job in the memory system 100 according to the present embodiment. The job manager 132 determines whether or not the job has been executed and completed properly (S110). The process returns to S110, for example, if the job is not executed and transitions to a wait state or if the job has not been completed properly due to an error or the like. If the job has been completed properly, the job manager 132 erases the job from the job queue (S112).

Figure 10:
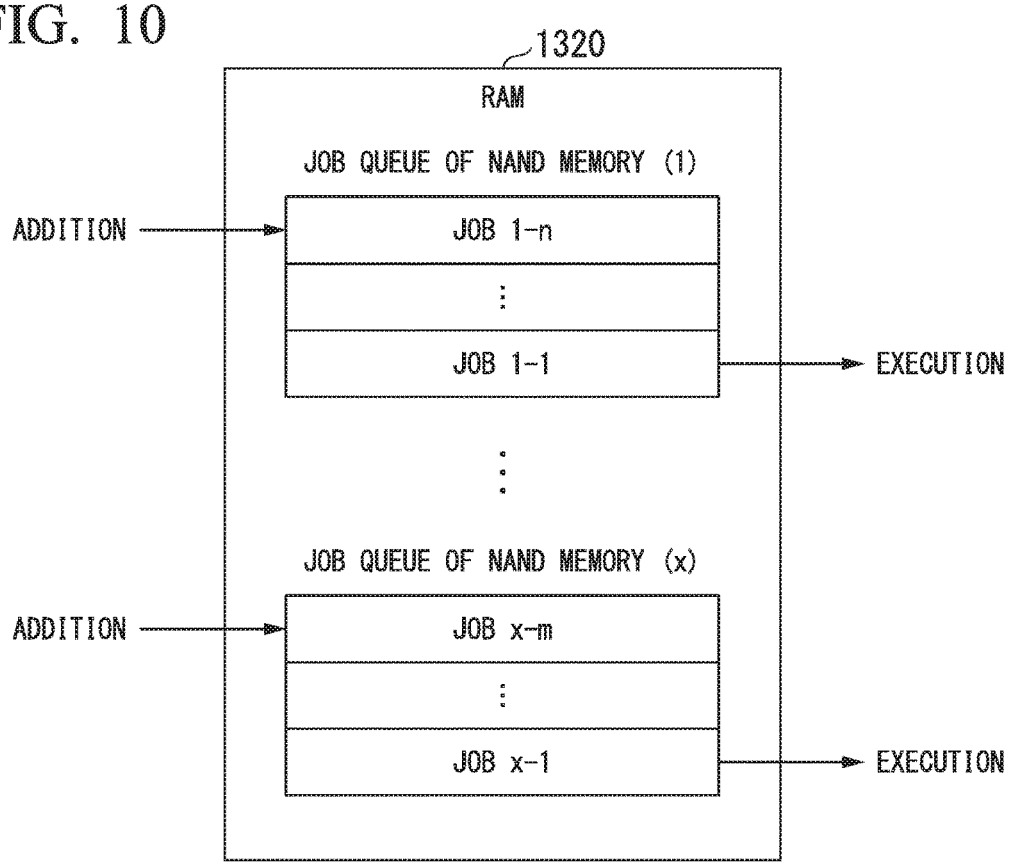
FIG. 10 illustrates a structure of a job queue used in the memory system according to the embodiment.

FIG. 10 illustrates a structure of a job queue established in the RAM 1320 of the memory system 100 according to the present embodiment. The job queue has a data structure in which a plurality of jobs is stored and executed in a predetermined execution order. Each of the plurality of job queues stored in the RAM 1320 corresponds to one of NAND memories (1) to (x). The jobs registered in the job queue are executed in the order in which they are registered in the job queue (i.e., a first-in first-out manner). The registry order of the job queue is based on timing at which the jobs were generated, but is not limited thereto and may be another condition. In the job queue of the NAND memory (1) in FIG. 10, the oldest job is a job 1-1 and the newest job is a job 1-n, wherein x, m, and n are natural numbers. The job is erased (removed) from the job queue if the job has been completed properly. The job remains in the job queue if the job has not been completed properly.

Figure 11:
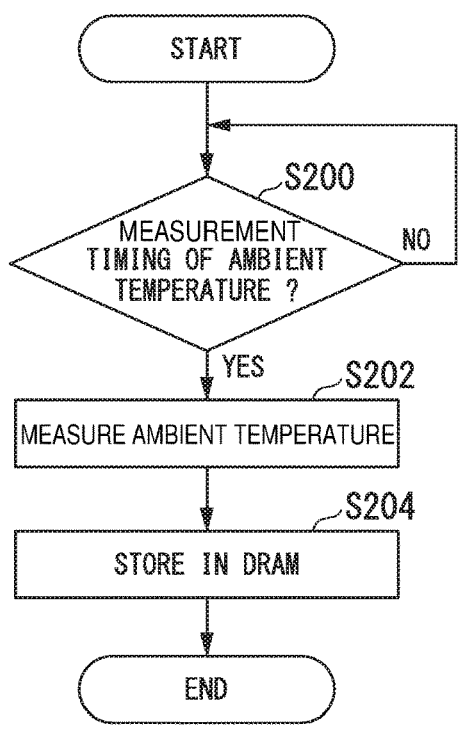
FIG. 11 is a flowchart illustrating a process of acquiring an ambient temperature, carried out in the memory system according to the embodiment.

FIG. 11 is a flowchart illustrating a process of acquiring an ambient temperature in the memory system 100 according to the present embodiment. The main controller 130 determines whether or not the measurement timing of the ambient temperature has come while the memory system 100 is activated (S200). The measurement timing of the ambient temperature comes every predetermined period set for management of the temperature of the NAND memory 110.

If it is determined that the measurement timing has come, the main controller 130 causes the ambient temperature sensor 150 to measure the ambient temperature (S202). The main controller 130 causes the DRAM 140 to store information indicating the ambient temperature measured by the ambient temperature sensor 150 (S204).

Figure 12:
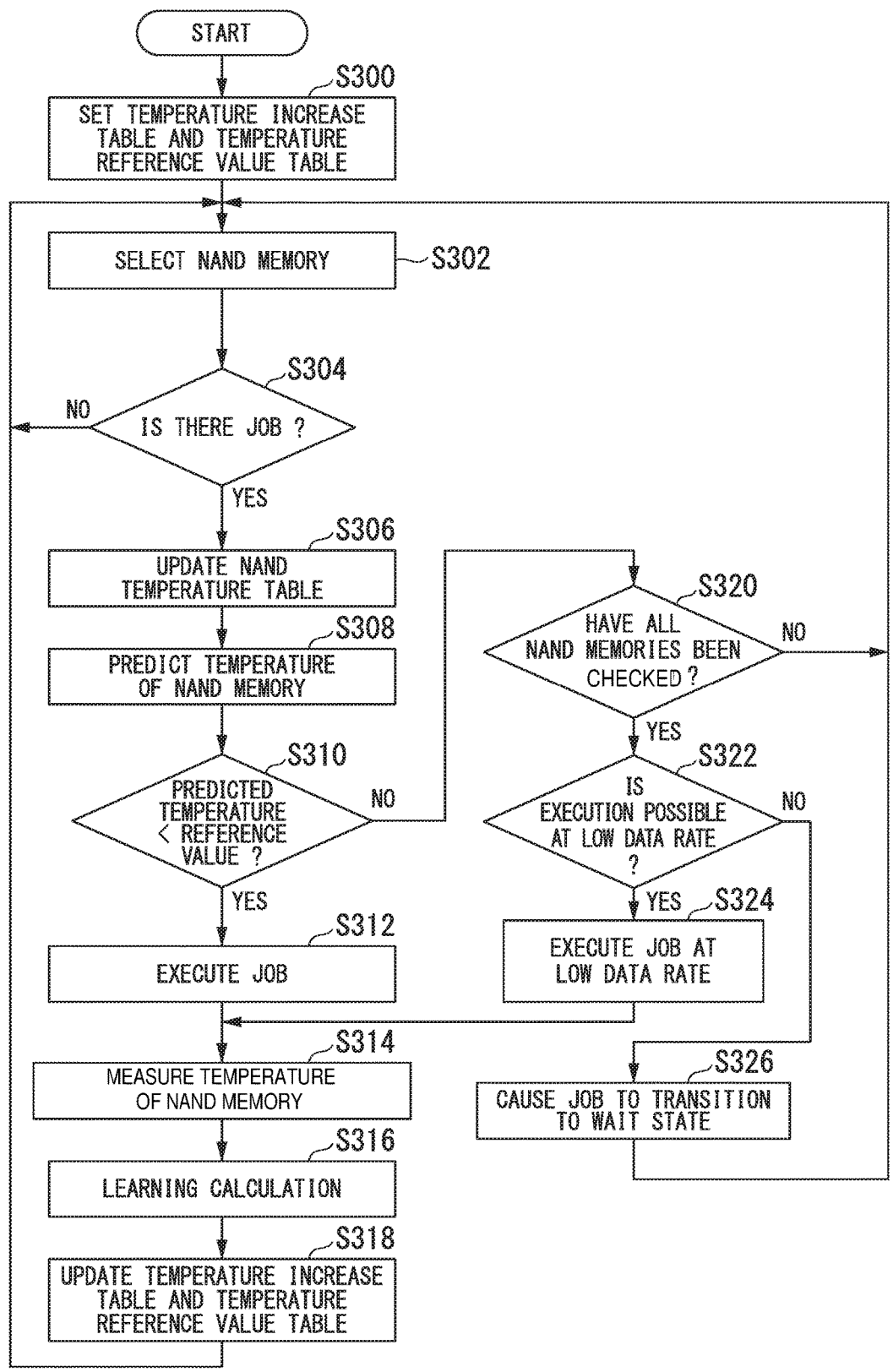
FIG. 12 is a flowchart illustrating a process of executing a job, carried out in the memory system according to the embodiment.

FIG. 12 is a flowchart illustrating a process of executing a job in the memory system 100 according to the present embodiment. The process of executing the job illustrated in FIG. 12 is assumed to be executed simultaneously with the process described with reference to FIGS. 9 and 11.

First, the job manager 132 initializes settings of the temperature increase table 1442 and the reference temperature table 1444 (S300). At this time, the job manager 132 reads the temperature increase table 1442 and the reference temperature table 1444 from the NAND memory 110. The job manager 132 loads the read temperature increase table 1442 and the read reference temperature table 1444 to the DRAM 140. Also, the process of S300 may be executed only once after the activation of the memory system 100.

Next, the job manager 132 selects one NAND memory 110 from the plurality of NAND memories 110 (S302). If the memory system 100 carries out selection of the NAND memory 110 first after being activated, the job manager 132 selects the NAND memory 110 in an ascending order of assigned numbers, i.e., a NAND memory 110 to which "1" is assigned in the job queue stored in the RAM 1320. Alternatively, the job manager 132 may select a NAND memory 110 with any order.

Next, the job manager 132 determines whether or not there is a job which has not been executed in the job queue corresponding to the selected NAND memory 110 (S303). The process returns to S302 if there is no job in the job queue, and the job manager 132 selects another NAND memory 110 to which a next larger number is attached.

The main controller 130 updates the NAND temperature table 1440 if there is a job in the job queue (S306). At this time, the main controller 130 updates at least the measured temperature of the NAND memory 110 for which it is determined that there is a job based on a signal transmitted from each of the chip temperature sensors 112 to the NAND controller 134.

Next, the temperature prediction unit 1322 predicts the temperature of the selected NAND memory 110 (S310). Here, the temperature prediction unit 1322 adds the temperature increase to the measured temperature updated in S306 with respect to the NAND memory 110 in which there is a job. At this time, the job manager 132 adds a temperature increase corresponding to a type of the command to the measured temperature updated in S306. Further, the temperature prediction unit 1322 corrects a value obtained by adding the temperature increase to the measured temperature updated in S306 using the ambient temperature. If the ambient temperature is higher than the measured temperature, the temperature prediction unit 1322 corrects the value obtained by adding the temperature increase to the measured temperature to a larger value. If the ambient temperature is lower than the measured temperature, the temperature prediction unit 1322 corrects the value obtained by adding the temperature increase to the measured temperature to a smaller value.

Next, the job manager 132 determines whether or not the temperature predicted in S310 is less than a temperature reference value in the reference temperature table 1444 (S310). If the temperature predicted in S310 is less than the temperature reference value, the job manager 132 transmits a command corresponding to the job to the selected NAND controller 134 (S312). Thereby, the job manager 132 ends the job. Next, the job manager 132 causes the chip temperature sensor 112 and the NAND controller 134 to measure the temperature of the selected NAND memory 110 (S314).

Next, the job manager 132 performs a learning calculation based on a difference between the measured temperature updated in S306 corresponding to the selected NAND memory 110 and the measured temperature measured in S310 with respect to the selected NAND memory 110 (S316).

At this time, the job manager 132 updates the temperature increase if the difference between the measured temperature updated in S306 and the measured temperature measured in S310 is greater or smaller than the temperature increase in the reference temperature table 1444b. That is, the job manager 132 updates the temperature increase to be increased if the difference between the measured temperature updated in S306 in the selected NAND memory 110 and the measured temperature measured in S310 in the selected NAND memory 110 is greater than the temperature increase in the reference temperature table 1444b, and updates the temperature increase to be decreased if the difference between the measured temperature updated in S306 in the selected NAND memory 110 and the measured temperature measured in S310 in the selected NAND memory 110 is less than the temperature increase in the reference temperature table 1444b.

Also, the job manager 132 updates the temperature reference value based on a relationship between the difference between the measured temperature updated in S306 and the measured temperature measured in S310 and the temperature increase. The job manager 132 updates the temperature reference value so as to be decreased if the difference between the measured temperature updated in S306 and the measured temperature measured in S310 is less than the temperature increase in the reference temperature table 1444. The job manager 132 updates the temperature reference value so as to be increased if the difference between the measured temperature updated in S306 and the measured temperature measured in S310 is greater than the temperature increase of the reference temperature table 1444.

Next, the job manager 132 updates the temperature increase table 1442 and the reference temperature table 1444 (S318). At this time, the job manager 132 updates data in the DRAM 140.

The job manager 132 determines whether or not the processing has been carried out for all NAND memories 110 if the predicted temperature is not less than the temperature reference value (S320). If it is determined that the processing has not been carried out for all NAND memories 110, the job manager 132 selects a NAND memory 110 other than the selected NAND memory 110 (S302). At this time, the job manager 132 may select a NAND memory 110 having a next larger number in the job queue stored in the RAM 1320, but the procedure is not limited thereto. That is, any non-selected NAND memory 110 may be selected.

If it is determined that the processing has been carried out for all NAND memories 110, the job manager 132 determines whether or not the job is executable at a low data transfer rate (S322). At this time, the job manager 132 reads the temperature increase table 1442 for the low data transfer rate from the DRAM 140. That is, in place of the temperature increase table 1442 for a predetermined data transfer rate, the job manager 132 calculates a predicted temperature of the selected NAND memory 100 based on the temperature increase included in the temperature increase table 1442 for the low data transfer rate. The job manager 132 determines whether or not the calculated predicted temperature is less than the temperature reference value. If the calculated predicted temperature is less than the temperature reference value, the job manager 132 determines that the job is executable at the low data transfer rate. On the other hand, if the calculated predicted temperature is not less than the temperature reference value, the job manager 132 determines that the job is not executable at the low data transfer rate.

If it is determined that the job is executable at the low data transfer rate, the job manager 132 changes the data transfer rate of the NAND interface 134a to a smaller value and causes a command corresponding to the job to be transmitted to the selected NAND memory 110. Thereby, the job manager 132 executes the job at the low data transfer rate (S324). Then, the job manager 132 ends the job.

If it is determined that the job is not executable at the low data transfer rate, the job manager 132 causes the state of the job to transition to the wait state (S326). Next, the job manager 132 selects a NAND memory 110 other than the selected NAND memory 110 (S302). At this time, the job manager 132 may select the NAND memory 110 having a next larger number in the job queue stored in the RAM 1320, but the procedure is not limited thereto. Any non-selected NAND memory 110 may be selected.

Thereby, the memory system 100 executes a process subsequent to S304 for the selected NAND memory 110. Thereafter, the job manager 132 can transmit a command corresponding to the job to a NAND memory 110 having a lowered temperature if the temperature of the NAND memory by which the job transitioning to the wait state is to be executed decreases.

Also, if the job is not executable at the low data transfer rate, the job manager 132 may preferentially execute a job having higher priority than the job and having a smaller temperature increase than the job as a result of lowering the priority of the job. The priority of the job is a condition for determining the order of a job to be executed among a plurality of jobs in the job queue. That is, the job manager 132 can execute a job having high priority before a job having an old added time by setting the priority of the job as an execution condition in place of (or in addition to) the timing of adding the job to the job queue.

The memory system 100 according to the present embodiment select a NAND memory 110 from the plurality of NAND memories 110 as a transmission destination of a command corresponding to a request received from the host device 200, based on temperature measured by the chip temperature sensor 112, the temperature increase, and the temperature reference value, and transmits the command to the selected NAND memory 110. As a result, it is possible to prevent the temperature of the NAND memory 110 for which an operation corresponding to the command has been executed from reaching the temperature reference value. Thereby, according to the memory system 100, it is possible to prevent a process from being stopped until the temperature of the memory system 100 decreases if the temperature of the memory system 100 has reached an upper limit value. Also, according to the memory system 100, it is possible to carry out lessor temperature throttling operations for adjusting non-execution in units of processing of reading, writing, or erasing based on a condition of temperature. As a result, according to the memory system 100, it possible to prevent a processing rate from rapidly decreasing and to increase stability of the processing rate.

Also, according to the memory system 100, it is possible to further increase stability of the processing rate by adjusting the temperature reference value according to an environment in which the memory system 100 operates, because the temperature increase is corrected based on the ambient temperature measured by the ambient temperature sensor 150.

Further, the memory system 100 adds the measured temperature to the temperature increase for every NAND memory 110 and selects one of the NAND memories 110 as the transmission destination of the command based on the obtained value. Thereby, according to the memory system 100, it is possible to prevent the measured temperature from reaching the temperature reference value in the selected NAND memory 110. As a result, the memory system 100 can further increase stability of the processing rate.

Further, the memory system 100 adds the measured temperature to the temperature increase corresponding specifically to the type of the command and selects one of the NAND memories 110 as the transmission destination of the command based on the obtained value. Thereby, according to the memory system 100, it is possible to further prevent the measured temperature from reaching the temperature reference value in the selected NAND memory 110. As a result, the memory system 100 can further increase stability of the processing rate.

Further, the memory system 100 measures a first temperature when an operation corresponding to a command has started and a second temperature when the operation corresponding to the command has ended and updates the temperature increase based on a difference between the first temperature and the second temperature. Thereby, according to the memory system 100, it is possible to increase precision of the temperature increase. As a result, the memory system 100 can further increase stability of the processing rate.

Further, the memory system 100 updates the temperature reference value based on the difference between the first temperature and the second temperature and the temperature increasing amount. Thereby, according to the memory system 100, it is possible to increase precision of the temperature reference value. As a result, the memory system 100 can further increase stability of the processing rate.

Further, the memory system 100 determines whether or not a value obtained by adding the temperature increase corresponding to a processing rate lower than a predetermined processing rate to the measured temperature exceeds the temperature reference value if there is no NAND memory 110 for which the value obtained by adding the temperature increase corresponding to a predetermined data rate to the measured temperature does not exceed the temperature reference value. Thereby, the memory system 100 can execute an operation corresponding to a command at a low processing rate and execute an operation corresponding to the command even when the predicted temperature is likely to reach the temperature reference value. As a result, according to the memory system 100, it is possible to prevent a job from being in the wait state.

The memory system 100 of the present embodiment may measure the temperature of a candidate NAND memory 110 if the candidate NAND memory 110 has been determined, but is not limited thereto.

Figure 13:
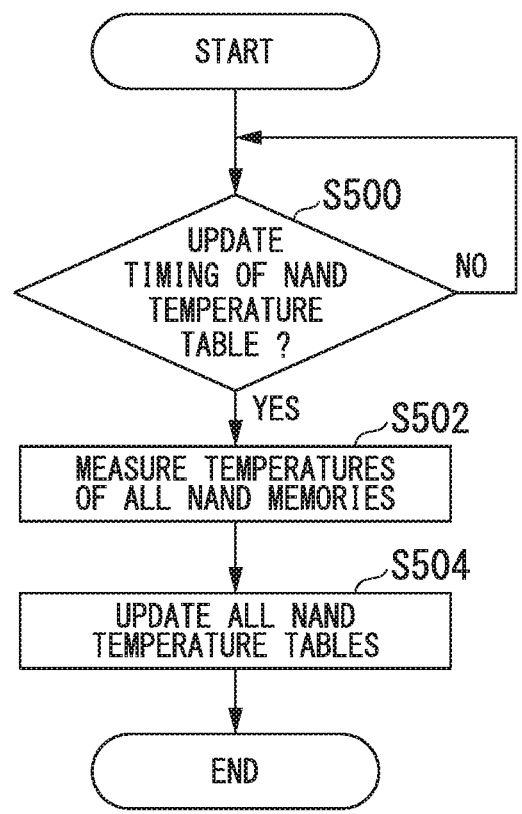
FIG. 13 is a flowchart illustrating a process of measuring temperature of a NAND memory, carried out in the memory system according to the embodiment.

FIG. 13 is a flowchart illustrating a process of measuring temperature of a NAND memory 110 in the memory system 100 according to the present embodiment. The main controller 130 determines whether or not the update timing of the NAND temperature table 1440 comes while the memory system 100 is activated (S500). The update timing of the NAND temperature table 1440 comes every predetermined period of time that is set for management of the temperature of the NAND memory 110. S306 of FIG. 11 is an example of the update timing of the NAND temperature table 1440. The main controller 130 waits until the update timing of the NAND temperature table 1440 comes.

If it is determined that the update timing of the NAND temperature table 1440 has come, the main controller 130 causes all chip temperature sensors 112 to measure temperatures of the NAND memories 110 (S502). The main controller 130 updates the measured temperatures of the NAND temperature table 1440 stored in the DRAM 140 to the measured temperatures of the NAND memories 110 (S504).

Also, although all chip temperature sensors 112 measure the temperatures of the NAND memories 110 and all measured temperatures in the NAND temperature table 1440 are updated in the process illustrated in FIG. 12, a process of updating the NAND temperature table 1440 in S306 of FIG. 12 is not limited thereto. It is only necessary to update the measured temperature of the NAND memory 110 in the process of updating the NAND temperature table 1440 in S306 of FIG. 12. Thereby, the memory system 100 can shorten a time required to update the NAND temperature table 1440 even when all the measured temperatures of the NAND temperature table 1440 are updated.

Figure 14:
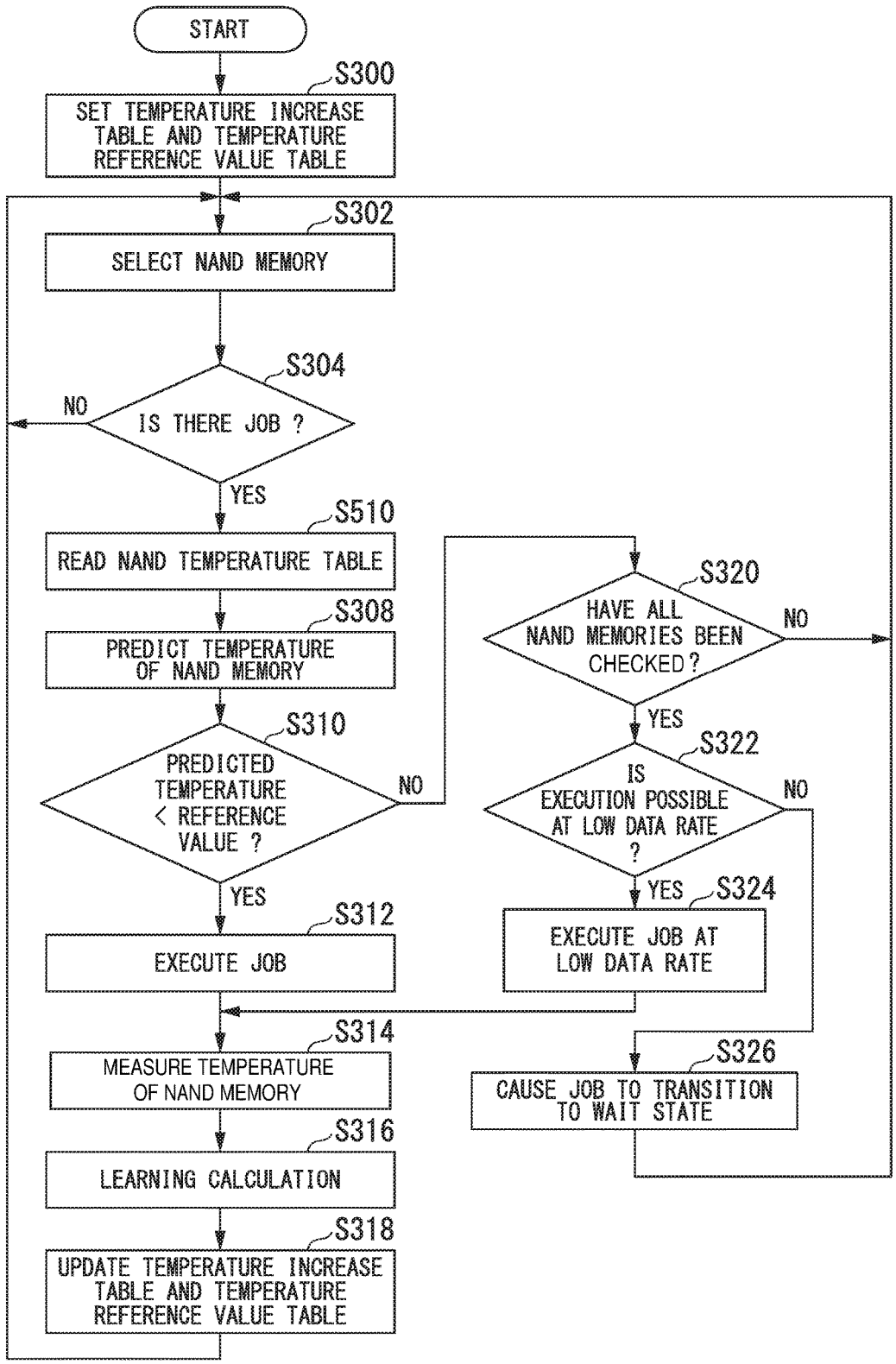
FIG. 14 is a flowchart illustrating another example of the process of executing a job.

FIG. 14 is a flowchart illustrating another example of the process of executing a job in the memory system 100 according to the present embodiment. The main controller 130 reads the measured temperature of the selected NAND memory 110 from the NAND temperature table 1440 if there is a job in the job queue of the selected NAND memory 110 (S510). The job manager 132 predicts a temperature after the job is executed based on the read measured temperature (S310).

According to this example, as in the above-described example, it is possible to further increase stability of the processing rate.

Hereinafter, it is assumed that priority information indicating that priority is higher than a reference is attached to a job and that one of the NAND memories 110 is selected as a transmission destination of the command based on a measured temperature, a temperature increase, and a temperature reference value if there is a job to which priority information is added. The "higher priority than the reference" is determined by executing firmware by the main controller 130. A process of reading management information such as the address conversion table or the block management table is an example of a job having the higher priority than the reference. This is because another process may not be executed if the management information cannot be read. A job of lower priority than the reference is a process having a small influence on the other processes when the state transitions to the wait state, but is not limited thereto. A process of writing data for backup of the data is an example of the job having lower priority than the reference.

Figure 15:
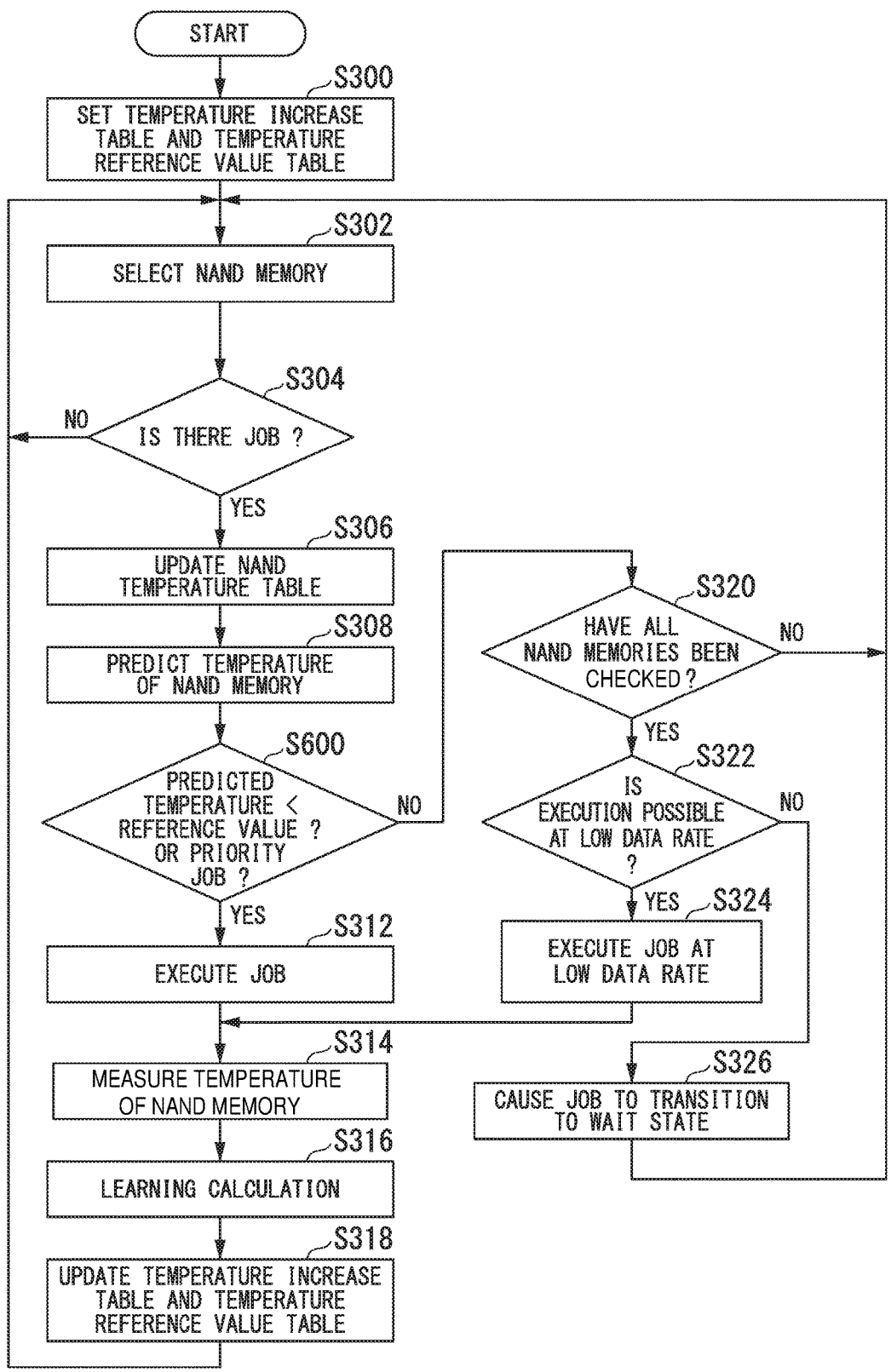
FIG. 15 is a flowchart illustrating still another example of the process of executing a job.

If a job has been generated, the job manager 132 adds priority information to a job having higher priority than the reference. The job to which the priority information is added is stored in the RAM 1320. FIG. 15 is a flowchart illustrating another example of a process of executing a job. If the temperature of the NAND memory 110 has been predicted (S308), the job manager 132 determines whether or not the predicted temperature is less than the temperature reference value or whether or not priority information is added to the job (S600).

If the predicted temperature is less than the temperature reference value, the job manager 132 executes the job (S312). If the predicted temperature is less than the temperature reference value and the priority information is attached to the job, the job manager 132 executes the job (S312). If the predicted temperature is not less than the temperature reference value but the priority information is attached to the job, the job manager 132 executes the job (S312). That is, the job manager 132 executes the job regardless of a relationship between the predicted temperature and the temperature reference value. The process proceeds to S320 if the predicted temperature is not less than the temperature reference value and no priority information is attached to the job.

According to the memory system 100, as in the above-described embodiment, it is possible to increase stability of the processing rate. Also, according to the memory system 100, it is possible to execute a job having high priority even when the predicted temperature is higher than the temperature reference value. Thereby, according to the memory system 100, it is possible to prevent a job having high priority from transitioning to the wait state when the predicted temperature is greater than the temperature reference value.

Hereinafter, it is assumed that if a second temperature reference value indicating a temperature greater than the temperature reference value included in the reference temperature table 1444 is stored and a job to which the priority information is attached is acquired to execute a job having higher priority than the reference, one of the NAND memories 110 is selected as the transmission destination of the command based on the measured temperature, the temperature increase, and the second temperature reference value.

Figures 16, 17:
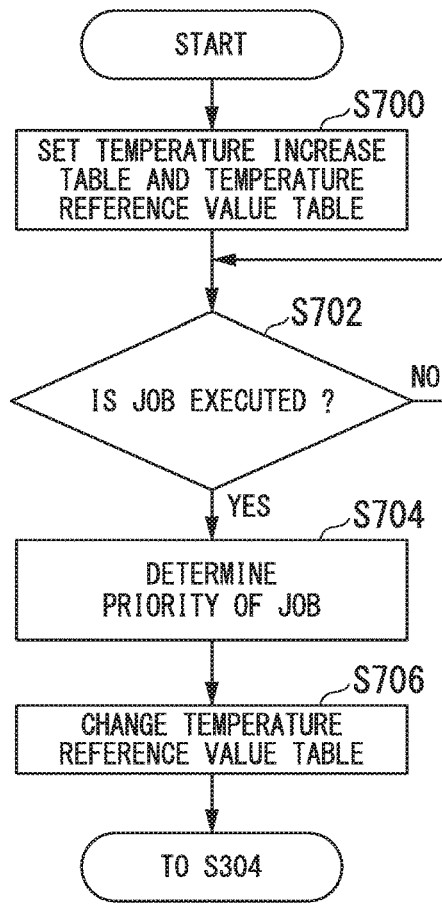
FIG. 16 illustrates another example of the reference temperature table used in the memory system according to the embodiment.
FIG. 17 is a flowchart illustrating another example of the process of executing a job, carried out in the memory system according to the embodiment.

FIG. 16 illustrates another example of the reference temperature table in the memory system 100 according to the present embodiment. In the NAND memory 110, the reference temperature table 1444 indicating a relationship between an ID and a temperature reference value is stored for each level of priority. Specifically, the reference temperature table 1444 includes a reference temperature table 1444a for "normal" priority and a reference temperature table 1444b for "high" priority. The reference temperature table 1444a includes information similar to that of the reference temperature table 1444 of the above-described example. In the reference temperature table 1444b, an ID is associated with an upper limit value (Tmax) of the temperature of the NAND memory 110. The upper limit value of the NAND memory 110 is a temperature as a determination reference for causing the state of the NAND memory 110 to transition to the wait state, but is not limited thereto.

FIG. 17 is a flowchart illustrating another example of a process of executing a job in the memory system 100 according to the present embodiment. If the memory system 100 is activated, the main controller 130 reads the temperature increase table 1442 and the reference temperature tables 1444a and 1444b from the NAND memory 110 and loads them to the DRAM 140 (S700).

The job manager 132 determines whether or not to execute the job (S702). If the job manager 132 determines to execute the job, the job manager 132 reads the job from the RAM 1320.

Next, the job manager 132 determines priority of the job based on priority information added to the job (S704). Next, the job manager 132 updates the reference temperature table 1444 based on the determined priority of the job (S706). If the priority of the job is "normal," the job manager 132 performs setting by referring to the reference temperature table 1444a and performs a process subsequent to S310. If the priority of the job is "high," the job manager 132 performs setting by referring to the reference temperature table 1444b and performs a process subsequent to S308.

If the job manager 132 performs setting by referring to the reference temperature table 1444b, the job manager 132 determines whether or not the predicted temperature is less than a temperature reference value (Tmax) in S310 or S600.

The memory system 100 according to this example stores the reference temperature table 1444b for a job of higher priority than the reference and selects one of the NAND memories 110 as the transmission destination of the command based on the measured temperature, the temperature increase, and the temperature reference value (Tmax) if the job of the higher priority than the reference is generated. According to the memory system 100, it is possible to widen options of the NAND memories 110 that is capable of executing an operation corresponding to the job having higher priority than the reference because the temperature reference value is changed to be greater than a normal temperature reference value. Thereby, according to the memory system 100, it is possible to quickly execute a job having higher priority than the reference.

According to the above-described embodiment, the memory system 100 includes the chip temperature sensor 112 which measures temperature of at least one of NAND memories 110 and the main controller 130 which selects one of the plurality of NAND memories 110 as the transmission destination of a command based on the temperature measured by the chip temperature sensor 112, a preset temperature increase, and a preset first temperature reference value if the command is transmitted to one of the NAND memories 110 and transmits the command to the selected NAND memory 110. As a result, it is possible to prevent a process from being stopped due to increase of the temperature of the memory system 100. As a result, according to at least one embodiment, it is possible to increase stability of the processing rate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a plurality of non-volatile memories;
   one or more temperature sensors each of which is disposed in or adjacent to one of the non-volatile memories; and
   a controller for the plurality of non-volatile memories, that is configured to
      maintain a temperature increase amount and a reference temperature for each of the non-volatile memories,
      select one of the non-volatile memories having a pending command as a next memory to be accessed based on a current temperature, the temperature increase amount, and the reference temperature of the selected non-volatile memory,
      access the selected non-volatile memory to perform the pending command, and
      with respect to the selected non-volatile memory, update the maintained temperature increase amount based on a difference of the current temperature of the selected non-volatile memory before the selected non-volatile memory is accessed and a temperature of the selected non-volatile memory after the selected non-volatile memory is accessed.

2. The memory system according to claim 1, wherein
the controller is further configured to carry out, with respect to the selected non-volatile memory, calculation of a predicted temperature based on a sum of the current temperature and the temperature increase amount and comparison of the predicted temperature with the reference temperature, and select one of the non-volatile memories as the next memory to be accessed when the reference temperature is greater than the predicted temperature.

3. The memory system according to claim 2, wherein
the controller is further configured to repeat, with respect to different one of the non-volatile memories, determination of the current temperature, calculation of the predicted temperature, and comparison of the predicted temperature with the reference temperature, until one of the non-volatile memories is selected as the next memory to be accessed, and if not, until processing of the determination, calculation and comparison is carried out for all of the non-volatile memories.

4. The memory system according to claim 3, wherein
the controller is further configured to access the selected non-volatile memory at a reduced data rate when none of the non-volatile memories is determined as the next memory to be accessed.

5. The memory system according to claim 2, wherein
the controller maintains, with respect to each of the non-volatile memories, a first temperature increase amount in association with commands of a first type, and a second temperature increase amount in association with commands of a second type,
calculates the predicted temperature based on a sum of the current temperature and the first temperature increase amount when the command is of the first type, and
calculates the predicted temperature based on a sum of the current temperature and the second temperature increase amount when the command is of the second type.

6. The memory system according to claim 2, wherein
the controller maintains, with respect to each of the non-volatile memories, a first reference temperature in association with commands of a first type, and a second reference temperature in association with commands of a second type,
the first reference temperature is used for the comparison when the command is of the first type, and
the second reference temperature is used for the comparison when the command is of the second type.

7. The memory system according to claim 2, further comprising:
a second temperature sensor disposed on a board on which the plurality of non-volatile memories and the controller are disposed, wherein
the controller calculates the predicted temperature also based on a signal transmitted from the second temperature sensor.

8. The memory system according to claim 1, wherein
the controller is further configured to, with respect to the selected non-volatile memory, update the maintained reference temperature based on a relationship between the temperature increase amount and the difference of the current temperature of the selected non-volatile memory before the selected non-volatile memory is accessed and the temperature of the selected non-volatile memory after the selected non-volatile memory is accessed.

9. The memory system according to claim 1, wherein
the signals are periodically transmitted from the one or more temperature sensors to the controller, and
the controller determines the current temperatures based on signals most recently transmitted from the one or more temperature sensors.

10. The memory system according to claim 1, wherein
the controller is configured to cause the one or more temperature sensors to transmit the signals to the controller, to determine the current temperatures.

11. The memory system according to claim 1, wherein
each of the non-volatile memories is a memory chip disposed on a board on which the controller is disposed.

12. The memory system according to claim 1, wherein
the controller is further configured to set a flag when the command is of a first type and not set the flag when the command is of a second type, select one of the non-volatile memories as the next memory to be accessed regardless of the current temperature, the temperature increase amount, and the reference temperature, when the flag is set, and determine the next memory to be accessed based on the current temperature, the temperature increase amount, and the reference temperature when the flag is not set.

13. An operation method of a memory system including a plurality of non-volatile memories, and one or more temperature sensors each of which is disposed in or adjacent to one of the non-volatile memories, the method comprising:
maintaining for each of the non-volatile memories, a first temperature increase amount in association with commands of a first type, a second temperature increase amount in association with commands of a second type, and a reference temperature; and
responsive to a command from a host,
selecting one of the non-volatile memories,
carrying out, with respect to the selected non-volatile memory, (i) calculation of a predicted temperature based on a sum of the current temperature and the first temperature increase amount when the command is of the first type, and based on a sum of the current temperature and the second temperature increase amount when the command is of the second type, and (ii) comparison of the predicted temperature with the reference temperature of the selected non-volatile memory, wherein the selected non-volatile memory is selected as a next memory to be accessed when the reference temperature is greater than the predicted temperature, and
accessing the selected non-volatile memory to perform the command from the host.

14. The method according to claim 13, further comprising:
repeating, with respect to different one of the non-volatile memories, determination of the current temperature, calculation of the predicted temperature, and comparison of the predicted temperature with the reference temperature, until one of the non-volatile memories is selected as the next memory to be accessed, and if not, until processing of the determination, calculation and comparison is carried out for all of the non-volatile memories.

15. The method according to claim 13, further comprising:
maintaining, with respect to each of the non-volatile memories, a first reference temperature in association with commands of a first type, and a second reference temperature in association with commands of a second type, wherein the first reference temperature is used for the comparison when the command is of the first type, and the second reference temperature is used for the comparison when the command is of the second type.

16. The method according to claim 13, further comprising:

with respect to the selected non-volatile memory, updating the maintained temperature increase amount based on a difference of the current temperature of the selected non-volatile memory before the selected non-volatile memory is accessed and a temperature of the selected non-volatile memory after the selected non-volatile memory is accessed.

17. The method according to claim 13, further comprising:

with respect to the selected non-volatile memory, updating the maintained reference temperature based on a relationship between the temperature increase amount and a difference of the current temperature of the selected non-volatile memory before the selected non-volatile memory is accessed and a temperature of the selected non-volatile memory after the selected non-volatile memory is accessed.

* * * * *